United States Patent [19]
Edwards

[11] 3,967,187
[45] June 29, 1976

[54] CURRENT LIMITING OF NOISE DIODES

[75] Inventor: Lon E. Edwards, Danbury, Conn.

[73] Assignee: Solitron Devices, Inc., Tappan, N.Y.

[22] Filed: Aug. 9, 1974

[21] Appl. No.: 496,140

[52] U.S. Cl. ................................. 323/4; 323/22 R; 328/162
[51] Int. Cl.² ........................................ H03B 29/00
[58] Field of Search ............. 307/304; 323/1, 9, 4, 323/16, 19, 22 R, 74, 79; 328/162; 332/18

[56] References Cited
UNITED STATES PATENTS

| | | |
|---|---|---|
| 3,428,884 | 2/1969 | Nordahl ............................ 323/79 X |
| 3,508,084 | 4/1970 | Warner .................................. 323/1 |
| 3,518,454 | 6/1970 | French ............................ 307/304 X |
| 3,535,616 | 10/1970 | Rutherford et al. ................ 323/4 X |
| 3,547,127 | 12/1970 | Anderson ......................... 323/1 UX |
| 3,579,091 | 5/1971 | Clarke et al. ..................... 332/18 X |

Primary Examiner—A. D. Pellinen
Attorney, Agent, or Firm—Richard G. Geib

[57] ABSTRACT

A current limiting circuit for a diode noise source improving noise output stability with changes in ambient operating temperature and variations in supply voltage.

2 Claims, 2 Drawing Figures

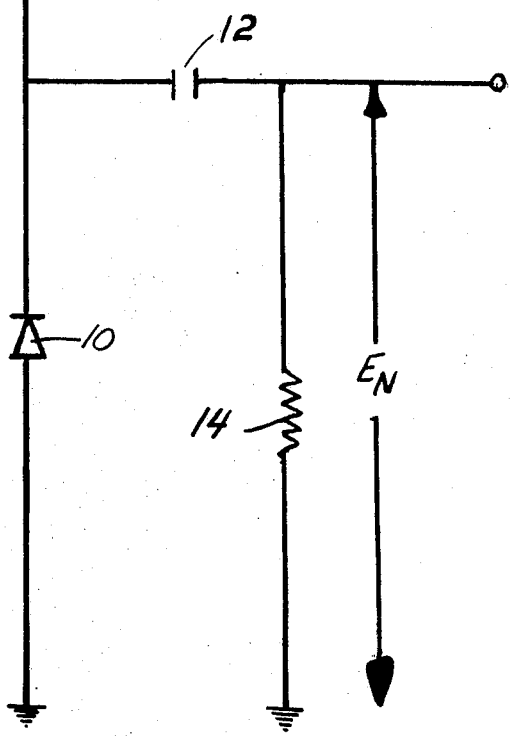
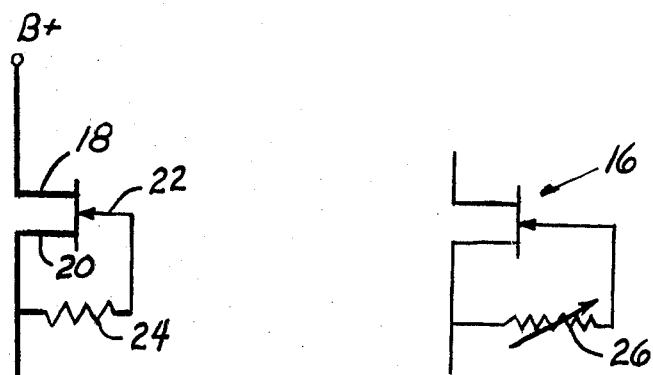
Fig. 2
Fig. 1

CURRENT LIMITING OF NOISE DIODES

BACKGROUND

Until recently it was thought desirable to reduce or eliminate noise to permit accurate and unambiguous information handling by electronic equipment. Today, however, increased knowledge of electrical noise reveals a structure which can be exploited for useful purposes.

The useful functions of electrical noise derive from its nature which is the result of movement of electric charges associated with electrons. Two aspects are especially significant. First, electrical noise contains frequencies from less than 1 Hz corresponding to the slow drift of electrons in a conductor to higher than microwave frequencies corresponding to the transit time of electron shifts in molecules. It has been found that electrical noise generators provide broad bands of frequencies without resort to many single frequency generators. Second, electrical noise is a useful source of randomly occuring pulses. Since the charges responsible for electrical noise process velocities that vary randomly, the amplitudes of the various electrical pulses also vary randomly. In most noise diode packages to date available, the noise diode is activated by supplying voltage through a current limiting resistor. However, in such packages it has been found that there can be a variance in current over an operating temperature range.

It is therefore a principle object of this invention to prevent current variation by means of a semiconductor device of low noise characteristics for supplying current for the noise diode.

It is a further object of this invention to provide a semiconductor device with a means to variably control current for a noise diode.

DESCRIPTION

FIG. 1 is a block drawing of a circuit in accordance with this invention; and

FIG. 2 is a schematic of a modification to the FET circuit of FIG. 1.

In FIG. 1 there is shown in schematic form a circuit diagram of a preferred embodiment for providing current limiting according to the foregoing for a noise diode circuit. More particularly, the basic noise generating circuit comprises a noise diode 10, capacitor 12 and resistor 14 for developing noise voltage $E_N$. In series with this circuit is a junction Field Effect Transistor (FET) 16 having its drain 18 connected to B+, its source 20 connected to the output of noise diode 10 and its gate 22 connected by a resistance 24 to the source-noise diode output which in FIG. 2 is replaced by a variable resistance 26.

In operation the noise diode is activated by supplying through the FET 16 with resistance 24 being tapped between source 20 and gate 22 thereof acting to limit the voltage level. This limited voltage activates the noise diode for supplying the desired noise frequency which is passed by the time delay circuit formed of capacitor 12 and resistance 14 which only passes the desired output frequency, impedance match.

As will be appreciated by those skilled in the art, the FET, with its very low noise characteristics will function because of the teachings of this invention of the resistance tap between the source and gate, will not allow variations in drain current over the specified temperature range for the circuit. This can be improved by providing a variable resistor 26 for the resistance 24. In any event it is possible with this circuit to develop a noise freqeuncy more predictably reliable.

I claim:
1. A random noise generator comprising:
   a semiconductor noise generating element;
   a time delay circuit for delivery of the output of said element at a desired frequency, impedance match; and
   a FET connected to a power source via its drain terminal and to said element via its source terminal for controlling current to said element, said FET having a single resistor tapped between said source terminal and a gate terminal thereof to control variations in drain current over a temperature range.
2. The structure of claim 1 wherein said resistor is a variable resistor.

* * * * *